United States Patent
Wu et al.

(10) Patent No.: US 11,450,796 B2
(45) Date of Patent: Sep. 20, 2022

(54) MICRO LIGHT EMITTING DIODE DISPLAY PANEL

(71) Applicant: PlayNitride Display Co., Ltd., MiaoLi County (TW)

(72) Inventors: Yin-En Wu, MiaoLi County (TW); Kuan-Yung Liao, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 120 days.

(21) Appl. No.: 17/102,308

(22) Filed: Nov. 23, 2020

(65) Prior Publication Data

US 2021/0296547 A1    Sep. 23, 2021

Related U.S. Application Data

(60) Provisional application No. 62/992,168, filed on Mar. 20, 2020.

(30) Foreign Application Priority Data

Aug. 19, 2020   (TW) .................................. 109128163

(51) Int. Cl.
   *H01L 33/62*    (2010.01)
   *H01L 27/15*    (2006.01)

(52) U.S. Cl.
   CPC ............ *H01L 33/62* (2013.01); *H01L 27/156* (2013.01)

(58) Field of Classification Search
   CPC ... H01L 33/62; H01L 27/156; H01L 25/0753; H01L 25/167
   See application file for complete search history.

(56) References Cited

U.S. PATENT DOCUMENTS

2007/0178617 A1    8/2007   Tsai et al.
2010/0148192 A1    6/2010   Jung et al.
(Continued)

FOREIGN PATENT DOCUMENTS

CN    1607432    4/2005
CN    1892385    1/2007
(Continued)

OTHER PUBLICATIONS

"Notice of allowance of China Counterpart Application", dated Mar. 9, 2022, p. 1-p. 5.
(Continued)

*Primary Examiner* — Victor A Mandala
(74) *Attorney, Agent, or Firm* — JCIPRNET (57) ABSTRACT

A micro light emitting diode display panel is provided, which includes a substrate, a plurality of first signal lines, a plurality of transparent conductive patterns, a plurality of metal conductive patterns, a plurality of first pads, a plurality of second pads, and a plurality of micro light emitting diode devices. The first signal lines are disposed on the substrate. The transparent conductive patterns are separately distributed on the substrate. The metal conductive patterns and the transparent conductive patterns are alternately arranged on the substrate. The metal conductive patterns are electrically connected between the transparent conductive patterns. The first pads are respectively connected to the first signal lines. The second pads are electrically connected to the transparent conductive patterns. Each of the micro light emitting diode devices is electrically bonded to one of the first pads and one of the second pads.

12 Claims, 10 Drawing Sheets

(56) References Cited

U.S. PATENT DOCUMENTS

| | | | |
|---|---|---|---|
| 2018/0374828 A1* | 12/2018 | Liao | H01L 25/167 |
| 2019/0148601 A1 | 5/2019 | Park et al. | |
| 2019/0157340 A1* | 5/2019 | Liao | H01L 27/156 |
| 2019/0305035 A1* | 10/2019 | Cho | H01L 33/46 |
| 2019/0348440 A1* | 11/2019 | Yu | H01L 33/44 |
| 2020/0185415 A1* | 6/2020 | Huang | H01L 27/124 |
| 2021/0358393 A1* | 11/2021 | Kang | H01L 33/62 |
| 2021/0408350 A1* | 12/2021 | Lo | H01L 24/10 |
| 2022/0102604 A1* | 3/2022 | Do | H01L 24/82 |
| 2022/0149079 A1* | 5/2022 | Kang | H01L 27/15 |

FOREIGN PATENT DOCUMENTS

| | | |
|---|---|---|
| CN | 101320771 | 12/2008 |
| CN | 102087450 | 6/2011 |
| CN | 102714018 | 10/2012 |
| CN | 103413810 | 11/2013 |
| CN | 105470274 | 4/2016 |
| CN | 106876406 | 6/2017 |
| CN | 109244101 | 1/2019 |
| CN | 109671732 | 4/2019 |
| CN | 109671821 | 4/2019 |
| CN | 110323212 | 10/2019 |
| CN | 110491896 | 11/2019 |
| CN | 110660813 | 1/2020 |
| CN | 110707119 | 1/2020 |
| CN | 110767642 | 2/2020 |
| CN | 110870065 | 3/2020 |
| WO | 2019139241 | 7/2019 |

OTHER PUBLICATIONS

"Office Action of China Counterpart Application", dated Sep. 28, 2021, p. 1-p. 7.

* cited by examiner

MICRO LIGHT EMITTING DIODE DISPLAY PANEL

CROSS-REFERENCE TO RELATED APPLICATION

This application claims the priority benefit of U.S. provisional application Ser. No. 62/992,168, filed on Mar. 20, 2020, and Taiwan patent application serial no. 109128163, filed on Aug. 19, 2020. The entirety of each of the above-mentioned patent applications is hereby incorporated by reference herein and made a part of this specification.

BACKGROUND

Technical Field

The disclosure relates to a display panel; particularly, the disclosure relates to a micro light emitting diode display panel.

Description of Related Art

With display technology constantly evolving, more diverse visual experiences have changed the way people obtain information. Displays play an extremely important role in, for example, advertisements and service information at shopping malls, dynamic information at transportation stations/stops, product display and information presentation of vending machines, or traffic information display during vehicle traveling, etc. In order to achieve more diverse usages, such as more intuitive information presentation and immersive visual experiences, transparent displays have become a development focus of relevant manufacturers.

Generally speaking, display pixels of micro light emitting diode display panels are formed of at least one micro light emitting diode. Of these micro light emitting diodes each, the electrodes are electrically connected to each other via the common electrode extending within the display area to achieve a common potential. At present, in production of the common electrode, indium tin oxide (ITO) having a high work function between 4.5 eV and 5.3 eV, a stable property, and high light transmittance is mostly selected as the electrode material. However, since the circuits and devices on the circuit substrate are not resistant to high temperatures, high-temperature annealing procedures cannot be performed for such common electrodes, and consequently the light transmittance and the conductivity of the common electrodes cannot be improved.

SUMMARY

The disclosure provides a micro light emitting diode display panel that has better light transmittance and a better driving property.

In the disclosure, the micro light emitting diode display panel includes a substrate, a plurality of first signal lines, a plurality of transparent conductive patterns, a plurality of metal conductive patterns, a plurality of first pads, a plurality of second pads, and a plurality of micro light emitting diode devices. The first signal lines are disposed on the substrate. The transparent conductive patterns are separately distributed on the substrate. The metal conductive patterns are arranged alternately with the transparent conductive patterns on the substrate, and the metal conductive patterns are electrically connected between the transparent conductive patterns. The first pads are respectively electrically connected to the first signal lines. These second pads are electrically connected to the transparent conductive patterns. The micro light emitting diode devices are each electrically bonded with one of the first pads and one of the second pads.

In the micro light emitting diode display panel according to an embodiment of the disclosure, the plurality of micro light emitting diode devices are respectively disposed between the transparent conductive patterns and are not overlapped with the transparent conductive patterns.

In the micro light emitting diode display panel according to an embodiment of the disclosure, each second pad and one of the metal conductive patterns are electrically connected or integrated.

In an embodiment of the disclosure, the micro light emitting diode display panel further includes an insulating layer disposed between the transparent conductive patterns and the metal conductive patterns. The insulating layer has a plurality of openings located between the transparent conductive patterns, and the metal conductive patterns are respectively located in the openings of the insulating layer.

In an embodiment of the disclosure, the metal conductive patterns, the first pads, and the second pads of the micro light emitting diode display panel belong to the same film layer.

In the micro light emitting diode display panel according to an embodiment of the disclosure, at least one micro light emitting diode device is overlapped with one of the transparent conductive patterns.

In the micro light emitting diode display panel according to an embodiment of the disclosure, the number of micro light emitting diode devices overlapped with the one of the transparent conductive patterns is three or more, and colors of light emitted by the micro light emitting diode devices are different.

In the micro light emitting diode display panel according to an embodiment of the disclosure, two adjacent transparent conductive patterns are connected to each other via one metal conductive pattern, and any second pad is overlapped with one of the transparent conductive patterns. In addition, the second pad and the metal conductive pattern are integrated.

In the micro light emitting diode display panel according to an embodiment of the disclosure, the transparent conductive patterns are located between the metal conductive patterns and the substrate.

In an embodiment of the disclosure, the micro light emitting diode display panel further includes a plurality of transistor devices and a plurality of second signal lines. The transistor devices are electrically connected to the micro light emitting diode devices and the first signal lines. The second signal lines are electrically connected to the transistor devices, and are electrically independent of the first signal lines. The metal conductive patterns and the second signal lines belong to the same film layer.

In an embodiment of the disclosure, the second signal lines of the micro light emitting diode display panel are not overlapped with the transparent conductive patterns.

Based on the foregoing, in the micro light emitting diode display panel of an embodiment of the disclosure, the conductive structure electrically connected to the plurality of second pads is composed of the transparent conductive patterns and metal conductive patterns which are alternately arranged. Since the transparent conductive patterns are structurally separated from each other, the overall light transmittance of the micro light emitting diode display panel can thus be increased. On the other hand, by employing the metal conductive patterns to electrically bridge the transparent conductive patterns, the conductivity of the conductive structure can be increased, thereby enhancing the driving property of the micro light emitting diode display panel.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the drawings, thicknesses of layers, films, panels, regions, etc., are exaggerated for the sake of clarity. It should be understood that when a device such as a layer, film, region, or substrate is referred to as being "on", or "connected to" another device, it may be directly on or connected to another device, or intermediate devices may also be present. In contrast, when a device is referred to as being "directly on" or "directly connected to" another device, no intermediate devices are present. As used herein, the term "connected" may refer to physical connection and/or electrical connection. Furthermore, "electrically connected" may encompass the presence of other devices between two devices.

Reference will now be made in detail to exemplary embodiments provided in the disclosure, examples of which are illustrated in the accompanying drawings. Wherever possible, identical reference numerals are used in the drawings and descriptions to refer to identical or similar parts.

Figure 1:
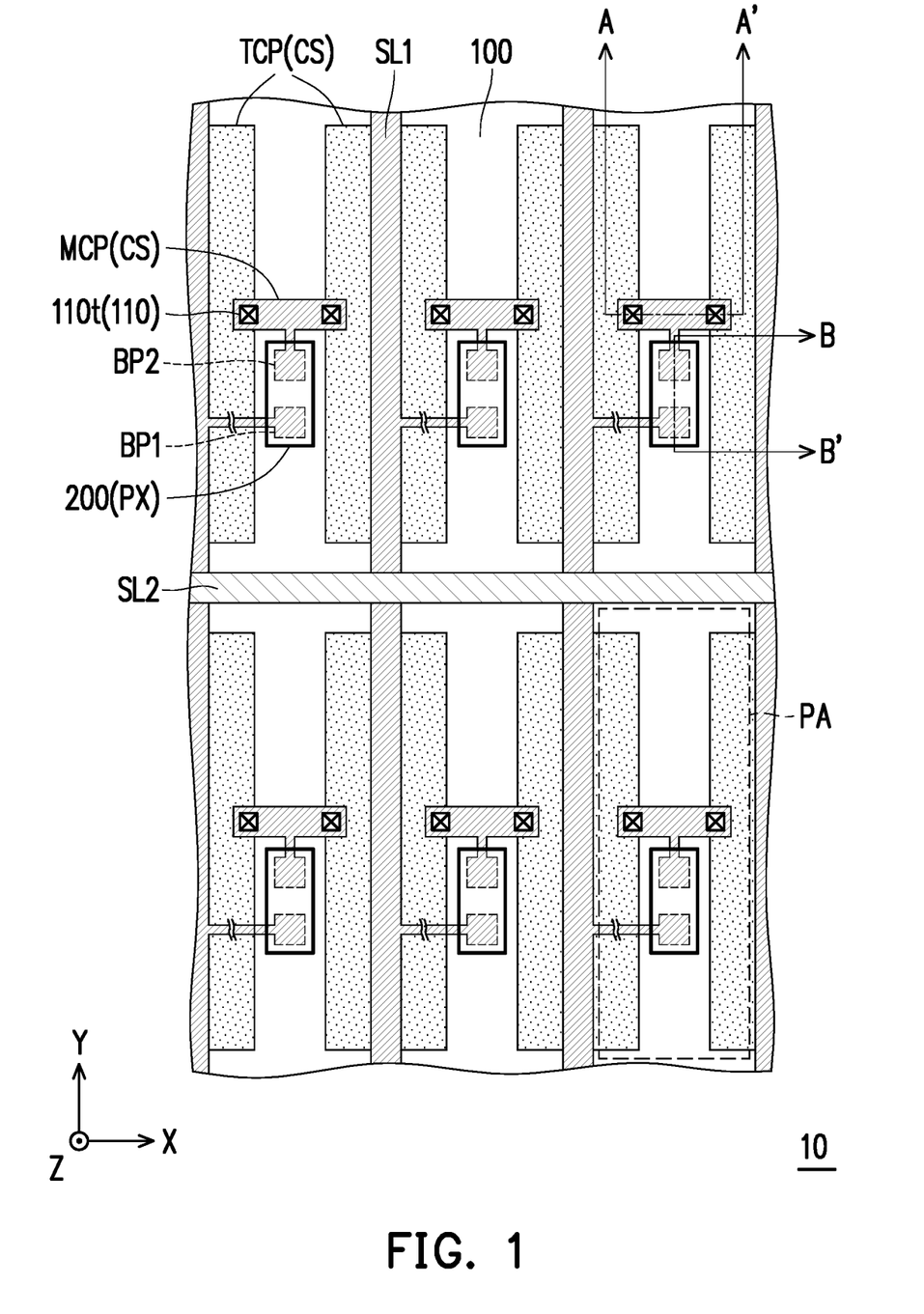
FIG. 1 is a schematic top view of a micro light emitting diode display panel according to the first embodiment of the disclosure.
Figure 2:
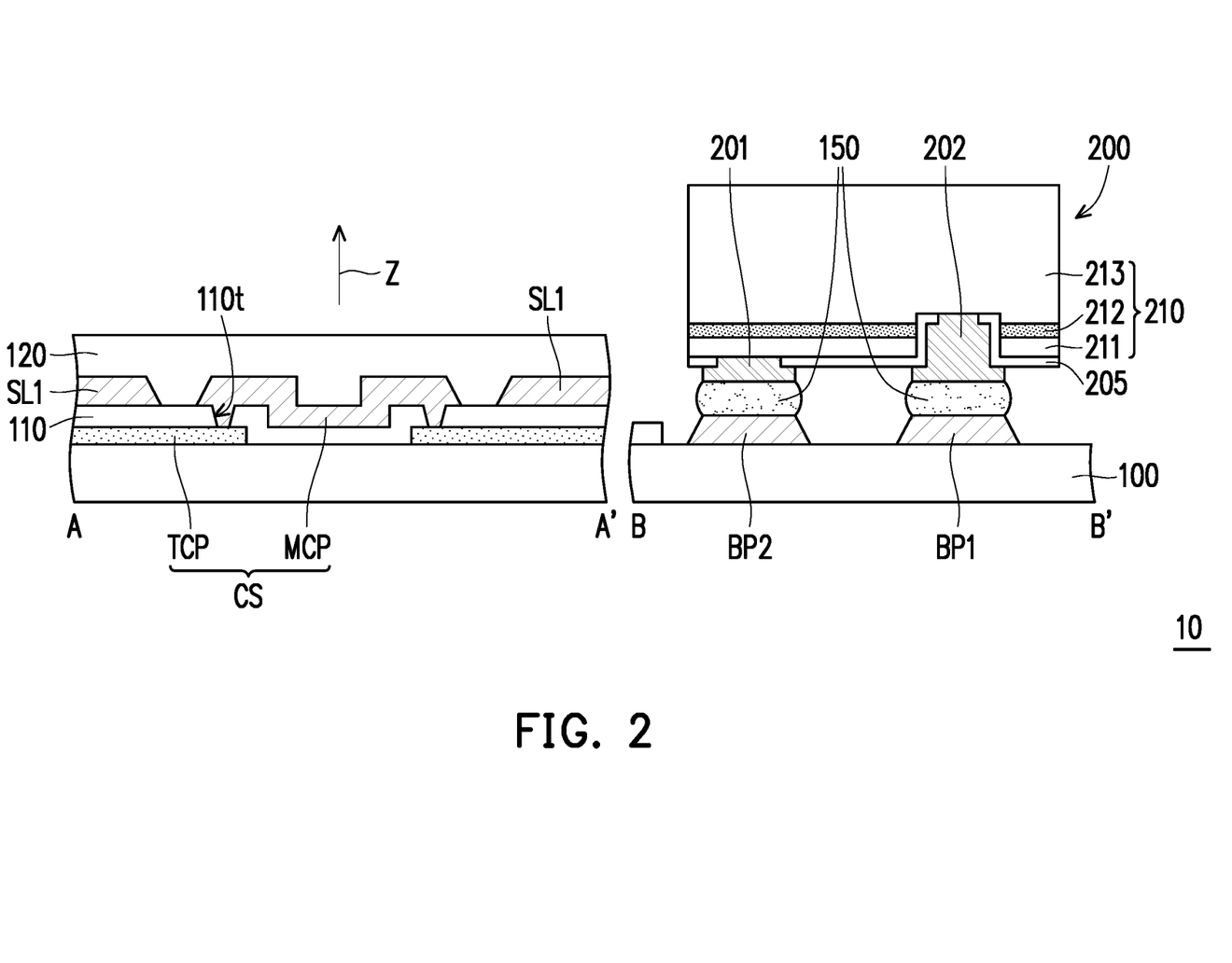
FIG. 2 is a schematic cross-sectional view of the micro light emitting diode display panel of FIG. 1.
Figure 3:
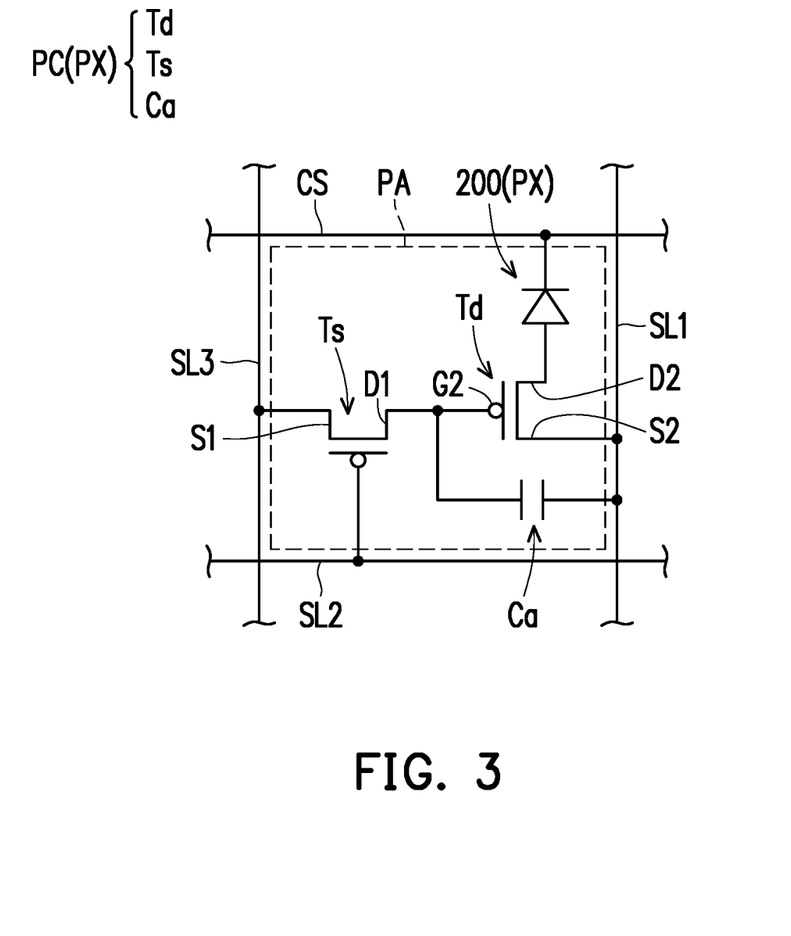
FIG. 3 is a schematic diagram of a pixel circuit of the micro light emitting diode display panel of FIG. 1.

FIG. 1 is a schematic top view of a micro light emitting diode display panel according to the first embodiment of the disclosure. FIG. 2 is a schematic cross-sectional view of the micro light emitting diode display panel of FIG. 1. FIG. 2 corresponds to section line A-A' and section line B-B' of FIG. 1. FIG. 3 is a schematic diagram of a pixel circuit of the micro light emitting diode display panel of FIG. 1. In particular, for the sake of clarity, FIG. 1 omits the illustration of interlayer insulating layer 120 of FIG. 2 and third signal line SL3, capacitor Ca, transistor device Td, and transistor device Ts of FIG. 3.

Referring to FIG. 1, FIG. 2, and FIG. 3, a micro light emitting diode display panel 10 includes a substrate 100 and a plurality of first signal lines SL1, a plurality of second signal lines SL2, a conductive structure CS, and a plurality of pixel structures PX disposed on the substrate 100. In this embodiment, the first signal lines SL1 are arranged along a direction X and extend in a direction Y, and the second signal lines SL2 are arranged along the direction Y and extend in the direction X. More specifically, the first signal lines SL1 are intersected with the second signal lines SL2 to define a plurality of pixel areas PA. In addition, the pixel structures PX are respectively disposed in the pixel areas PA. The material of the substrate 100 is, for example, glass, quartz, or another suitable polymer material (e.g., polyimide, polycarbonate, or polyethylene terephthalate).

The conductive structure CS has a plurality of transparent conductive patterns TCP and a plurality of metal conductive patterns MCP which are alternately arranged. The transparent conductive patterns TCP are structurally separated from each other and distributed on the substrate 100. Moreover, the metal conductive patterns MCP are alternately arranged with the transparent conductive patterns TCP, and are electrically connected between the transparent conductive patterns TCP. In this embodiment, the metal conductive patterns MCP and the transparent conductive patterns TCP may respectively form a plurality of conductive strings extending in the direction X, and the conductive strings arranged along the direction Y are electrically independent of each other. However, the disclosure is not limited thereto. In other embodiments, the conductive strings may as well be electrically connected to each other. For example, some other metal conductive patterns MCP and part of the transparent conductive patterns TCP of the conductive strings may as well be alternately arranged in the direction Y to electrically bridge the conductive strings.

The material of the transparent conductive pattern TCP includes indium tin oxide, indium zinc oxide, aluminum tin oxide, aluminum zinc oxide, or other suitable oxides, an extremely thin metal, a carbon nanotube, graphene, or a stacked layer of at least two of the above, or other suitable transparent conductive materials. Based on the consideration of conductivity, a metal material is generally adopted as the material of the first signal line SL1, the second signal line SL2, and the metal conductive pattern MCP. However, the disclosure is not limited thereto. According to other embodiments, the first signal line SL1, the second signal line SL2, and the metal conductive pattern MCP may also adopt another conductive material, such as an alloy, a nitride of metal material, an oxide of metal material, an oxynitride of metal material, or another suitable material, or a stacked layer of a metal material and another conductive material.

Furthermore, the pixel structure PX includes a micro light emitting diode device 200. The micro light emitting diode device 200 is disposed between two adjacent transparent conductive patterns TCP, and is electrically connected to one corresponding first signal line SL1 and one corresponding metal conductive pattern MCP. Notably, the transparent conductive patterns TCP are respectively overlapped with the plurality of first signal lines SL1 in a normal direction (e.g., a direction Z) of the substrate 100, and are not overlapped with the plurality of micro light emitting diode devices 200 of the plurality of pixel structures PX. Accordingly, the overall light transmittance of the micro light emitting diode display panel 10 can be increased.

To electrically bond the micro light emitting diode device 200, the micro light emitting diode display panel 10 further includes a plurality of pads (e.g., a first pad BP1 and a second pad BP2) disposed in the plurality of pixel areas PA. It should be noted that in this embodiment, as an example for exemplary description, the number of pads located in the same pixel area PA is two, but the disclosure is limited thereto. In other embodiments, the number of pads located in the same pixel area PA may as well be adjusted as four or six or more according to the number of bonds of the micro light emitting diode device 200. That is to say, in other embodiments, the number of micro light emitting diode devices 200 located in the same pixel area PA may also be two or more.

Following the foregoing, the first pad BP1 and the second pad BP2 located in the same pixel area PA are electrically connected to one corresponding first signal line SL1 and one corresponding metal conductive pattern MCP, respectively. In this embodiment, the first signal line SL1, the first pad BP1, the second pad BP2, and the metal conductive pattern MCP may selectively belong to the same film layer, but are not limited thereto. More specifically, the second pad BP2 and the metal conductive pattern MCP may be electrically connected or integrated to simplify procedures of the manufacturing process, but are not limited thereto.

In a further embodiment, the pixel structure PX further includes a pixel circuit PC (as shown in FIG. 3) configured to drive the micro light emitting diode device 200. The pixel circuit PC is electrically connected to one corresponding first signal line SL1, one corresponding second signal line SL2, and one corresponding first pad BP1. For example, the pixel circuit PC may include a transistor device Ts, a transistor device Td, and a capacitor Ca. The transistor device Ts is electrically connected between the transistor device Td and the second signal line SL2, and the transistor device Td is electrically connected between the micro light emitting diode device 200 (or the first pad BP1) and the first signal line SL1.

In this embodiment, the micro light emitting diode display panel 10 further includes an insulating layer 110 and an interlayer insulating layer 120. The insulating layer 110 is disposed between the transparent conductive pattern TCP and the metal conductive pattern MCP, and the transparent conductive pattern TCP is located between the substrate 100 and the insulating layer 110. However, the disclosure is not limited thereto. The insulating layer 110 is provided with a plurality of contacts 110*t* to communicate with the transparent conductive pattern TCP, and each metal conductive pattern MCP is electrically connected to two adjacent transparent conductive patterns TCP via two corresponding contacts 110*t*.

On the other hand, the interlayer insulating layer 120 is provided, for example, between a film layer where the first signal line SL1 (the metal conductive pattern MCP) belongs and a film layer where the second signal line SL2 belongs. The material of the insulating layer 110 and the interlayer insulating layer 120 is, for example, an inorganic material (e.g., a silicon oxide, a silicon nitride, a silicon oxynitride, another suitable material, or a stacked layer of at least two of the above materials), an organic material, or another suitable material, or a combination of the above.

In addition, the micro light emitting diode display panel 10 further includes a plurality of third signal lines SL3. A source S1, a drain D1, and a gate G1 of the transistor device Ts are electrically connected to one corresponding third signal line SL3, a gate G2 of the transistor device Td, and a corresponding second signal line SL2, respectively. A source S2 and a drain D2 of the transistor device Td are electrically connected to one corresponding first signal line SL1 and the micro light emitting diode device 200 (or the first pad BP1) of the same pixel structure PX. The capacitor Ca is electrically connected between the gate G2 of the transistor device Td (or the drain D1 of the transistor device Ts) and one corresponding first signal line SL1. In this embodiment, the transistor device Ts is, for example, a switch transistor, and the transistor device Td is, for example, a drive transistor. Furthermore, the first signal line SL1, the second signal line SL2, and the third signal line SL3 may be configured to respectively transmit a power signal (such as a Vdd), a gate drive signal, and a switch signal.

That is to say, a driving circuit layer of the micro light emitting diode display panel 10 in this embodiment is configured as an active matrix, and the micro light emitting diode device 200 is driven by the pixel circuit PC having a 2T1C configuration. However, the disclosure is not limited thereto. According to other embodiments, the micro light emitting diode device 200 may also be driven by a driving unit having a 1T1C configuration, a 3T1C configuration, a 3T2C configuration, a 4T1C configuration, a 4T2C configuration, a 5T1C configuration, a 5T2C configuration, a 6T1C configuration, a 6T2C configuration, a 7T2C configuration, or any possible configuration. In other embodiments, it is possible that the driving circuit layer of the micro light emitting diode display panel does not include the transistor device. That is, the driving circuit layer is configured as a passive matrix.

In this embodiment, the plurality of second pads BP2 arranged along the direction X are all electrically connected to the same one conductive string of the conductive structure CS. That is to say, the conductive structure CS in this embodiment can provide the second pad BP2 with a common potential, and the common potential may be a ground potential or a fixed potential. Notably, since the plurality of transparent conductive patterns TCP of the conductive structure CS are structurally separated from each other, the overall light transmittance of the micro light emitting diode display panel 10 can be increased. On the other hand, by employing the plurality of metal conductive patterns MCP that are separated from each other to electrically bridge the transparent conductive patterns TCP, the conductivity of the conductive structure CS can be increased, thereby enhancing the driving property of the micro light emitting diode display panel 10.

In this embodiment, the micro light emitting diode device 200 includes a first electrode 201, a second electrode 202, an insulating layer 205, and an epitaxial structure 210. The first electrode 201 and the second electrode 202 are disposed on the same side of the epitaxial structure 210; that is to say, the micro light emitting diode device 200 is a flip-chip type micro light emitting device. To be specific, the epitaxial structure 210 includes a first type semiconductor layer 211, a light emitting layer 212, and a second type semiconductor layer 213. The first electrode 201 penetrates the insulating layer 205 to be electrically connected to the first type semiconductor layer 211, and the second electrode 202 penetrates the insulating layer 205, the first type semiconductor layer 211, and the light emitting layer 212 to be electrically connected to the second type semiconductor layer 213. For example, two electrodes (e.g., the first electrode 201 and the second electrode 202) of the micro light emitting diode device 200 may be electrically connected to two corresponding pads (e.g., the first pad BP1 and the second pad BP2) via a solder 150, but are not limited thereto. In other embodiments, the electrode of the micro light emitting diode device 200 may as well be electrically connected to the corresponding pad via a conductive material such as a conductive bump and a conductive paste.

Hereinafter, other embodiments will be described to explain the disclosure in detail. The same components will be annotated with the same reference numerals, and the description of the same technical content will be omitted. Reference can be made to the foregoing embodiments for the omitted part, which will not be repeatedly described herein.

Figure 4:
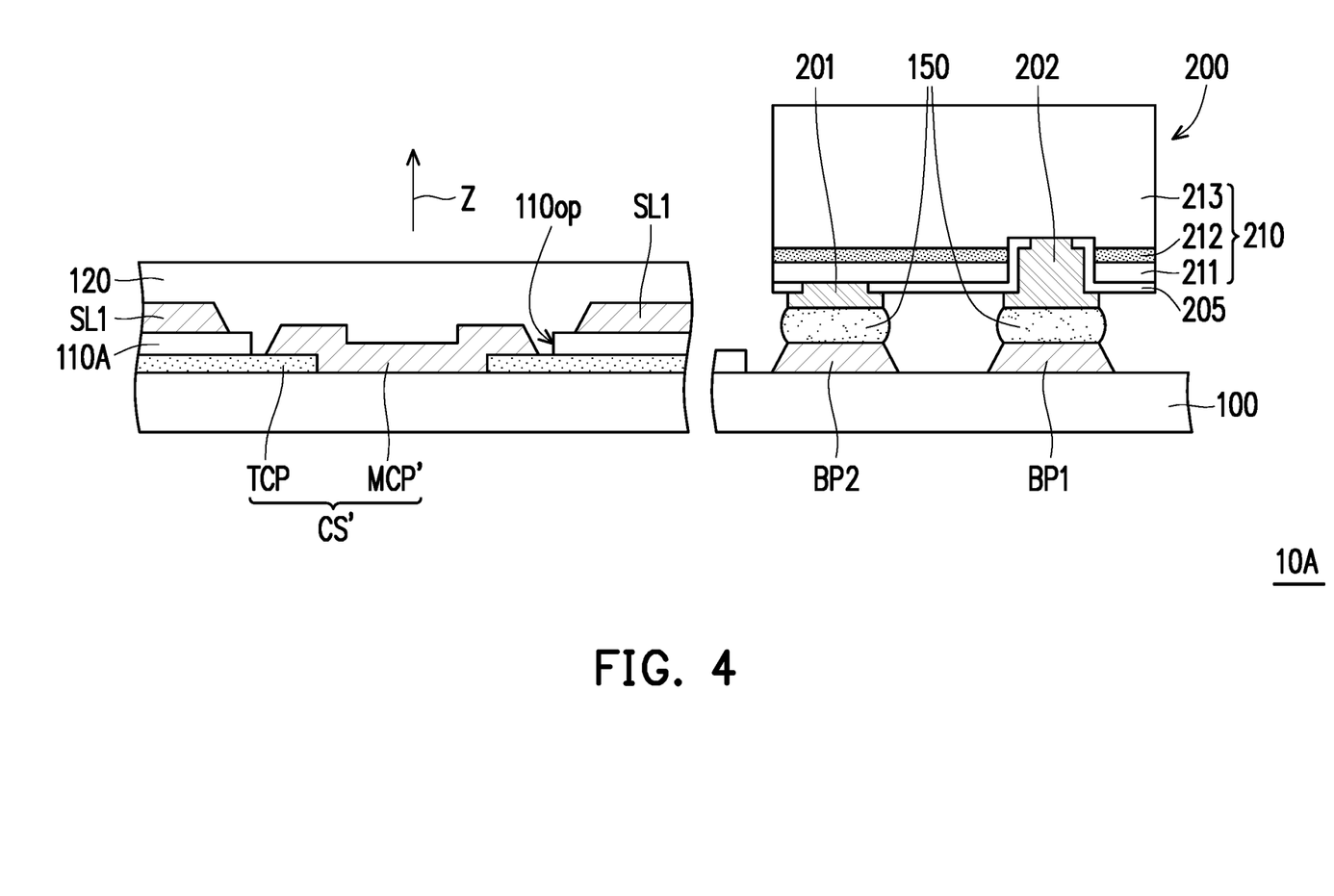
FIG. 4 is a schematic cross-sectional view of a micro light emitting diode display panel according to the second embodiment of the disclosure.

FIG. 4 is a schematic cross-sectional view of a micro light emitting diode display panel according to the second embodiment of the disclosure. Referring to FIG. 4, the difference between a micro light emitting diode display panel 10A in this embodiment and the micro light emitting diode display panel 10 of FIG. 2 lies in that the contact between the transparent conductive pattern and the metal conductive pattern is different. Specifically, an insulating layer 110A of the micro light emitting diode display panel 10A has a plurality of openings 110op. The openings 110op are located between the plurality of transparent conductive patterns TCP of a conductive structure CS', and expose two opposite sides of each transparent conductive pattern TCP. A plurality of metal conductive patterns MCP' of the conductive structure CS' are respectively located in the openings 110op of the insulating layer 110A, and directly cover the two sides of each transparent conductive pattern TCP. As a contact area between the metal conductive pattern MCP' and the transparent conductive pattern TCP is increased, the conductivity of the conductive structure CS' can be further improved.

Figure 5:
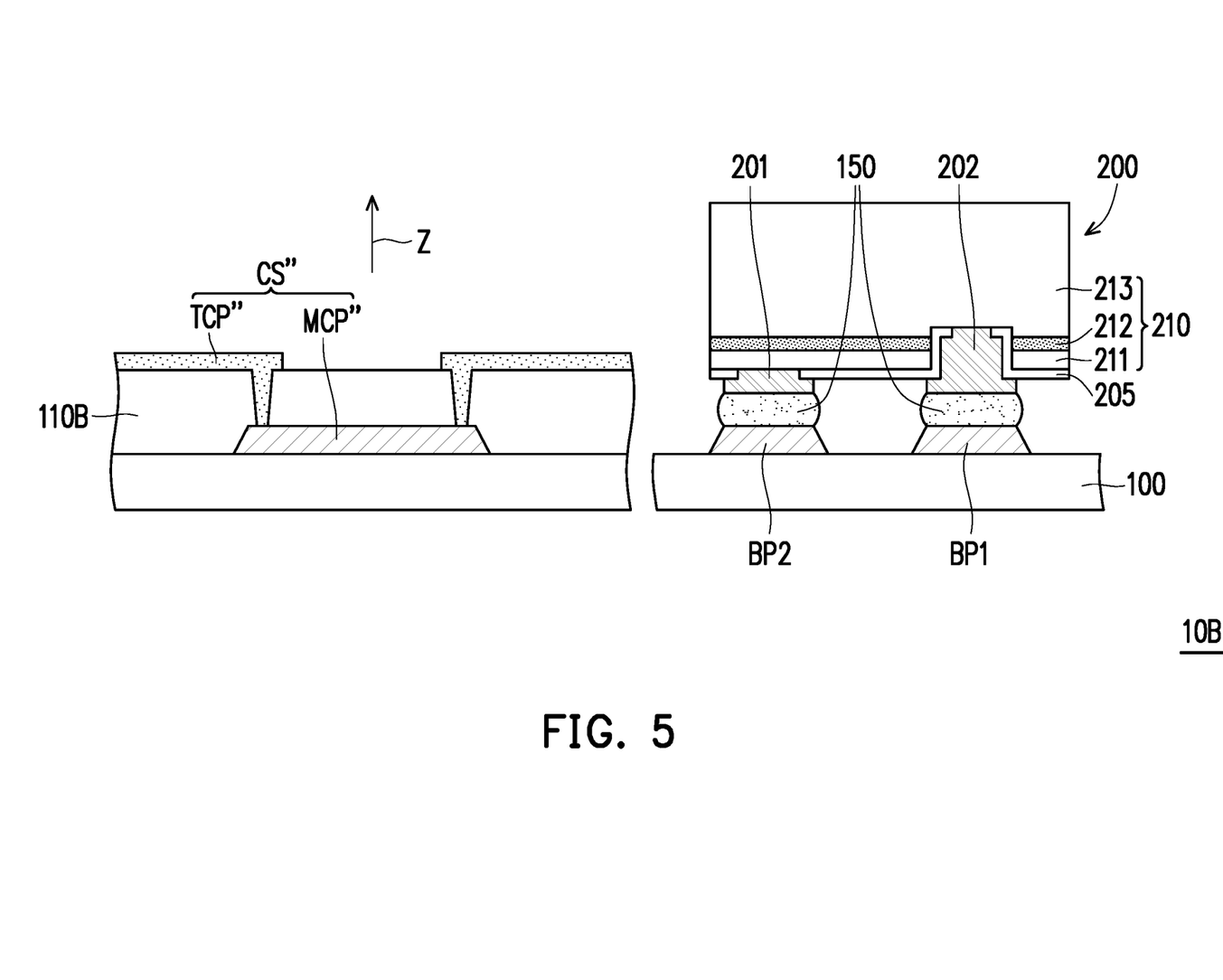
FIG. 5 is a schematic cross-sectional view of a micro light emitting diode display panel according to the third embodiment of the disclosure.

FIG. 5 is a schematic cross-sectional view of a micro light emitting diode display panel according to the third embodiment of the disclosure. Referring to FIG. 5, the difference between a micro light emitting diode display panel 10B in this embodiment and the micro light emitting diode display panel 10 of FIG. 2 lies in that the configuration of the conductive structure is different. In this embodiment, a metal conductive pattern MCP" of a conductive structure CS" is located between the substrate 100 and a transparent conductive pattern TCP". More specifically, an insulating layer 110B of the micro light emitting diode display panel 10B may be an interlayer insulating layer or a planarization layer located between the first signal line SL1 and the second signal line SL2 as shown in FIG. 1. In addition, the transparent conductive pattern TCP" is disposed above a conductive layer to which the insulating layer 110B and the above-mentioned signal lines belong, and two adjacent transparent conductive patterns TCP" penetrate the insulating layer 110B to be electrically connected to the same metal conductive pattern MCP"'. Accordingly, the design flexibility and the process window of the conductive structure CS" can be increased.

Figure 6:
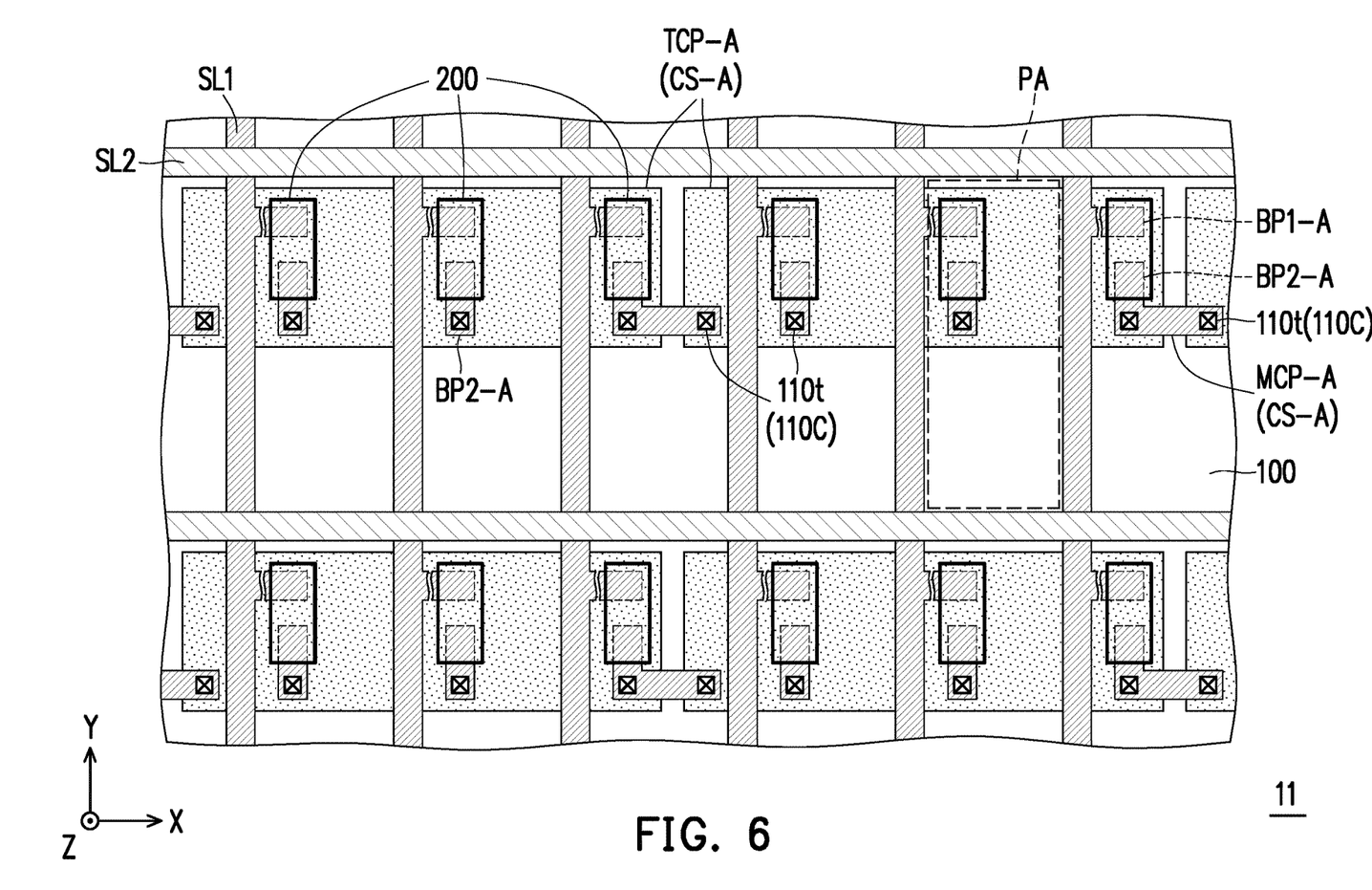
FIG. 6 is a schematic top view of a micro light emitting diode display panel according to the fourth embodiment of the disclosure.

FIG. 6 is a schematic top view of a micro light emitting diode display panel according to the fourth embodiment of the disclosure. Referring to FIG. 6, the main difference between a micro light emitting diode display panel 11 in this embodiment and the micro light emitting diode display panel 10 of FIG. 1 lies in that the configuration of the conductive structure is different. Specifically, a plurality of transparent conductive patterns TCP-A of a conductive structure CS-A of the micro light emitting diode display panel 11 may be overlapped with the plurality of micro light emitting diode devices 200 in the normal direction (e.g., the direction Z) of the substrate 100.

In this embodiment, the number of micro light emitting diode devices 200 that are overlapped with the same transparent conductive pattern TCP-A is three, and colors of light emitted by the three micro light emitting diode devices 200 are different. For example, the colors of the light emitted by the three micro light emitting diode devices 200 may be respectively selected from red, green, and blue.

From another point of view, the plurality of pads (e.g., a first pad BP1-A and a second pad BP2-A) configured to bond the micro light emitting diode device 200 are also overlapped with the transparent conductive pattern TCP-A. The plurality of second pads BP2-A are electrically connected to the corresponding transparent conductive patterns TCP-A respectively via a plurality of contacts 110t of an insulating layer 110C. Notably, any two adjacent transparent conductive patterns TCP-A may be electrically bridged via the metal conductive pattern MCP-A, and the metal conductive pattern MCP-A may be integrated with one of the second pads BP2-A overlapped with the two transparent conductive patterns TCP-A. Accordingly, the overall light transmittance of the micro light emitting diode display panel 11 can be further increased, and procedures of the manufacturing process can be simplified.

Figure 7:
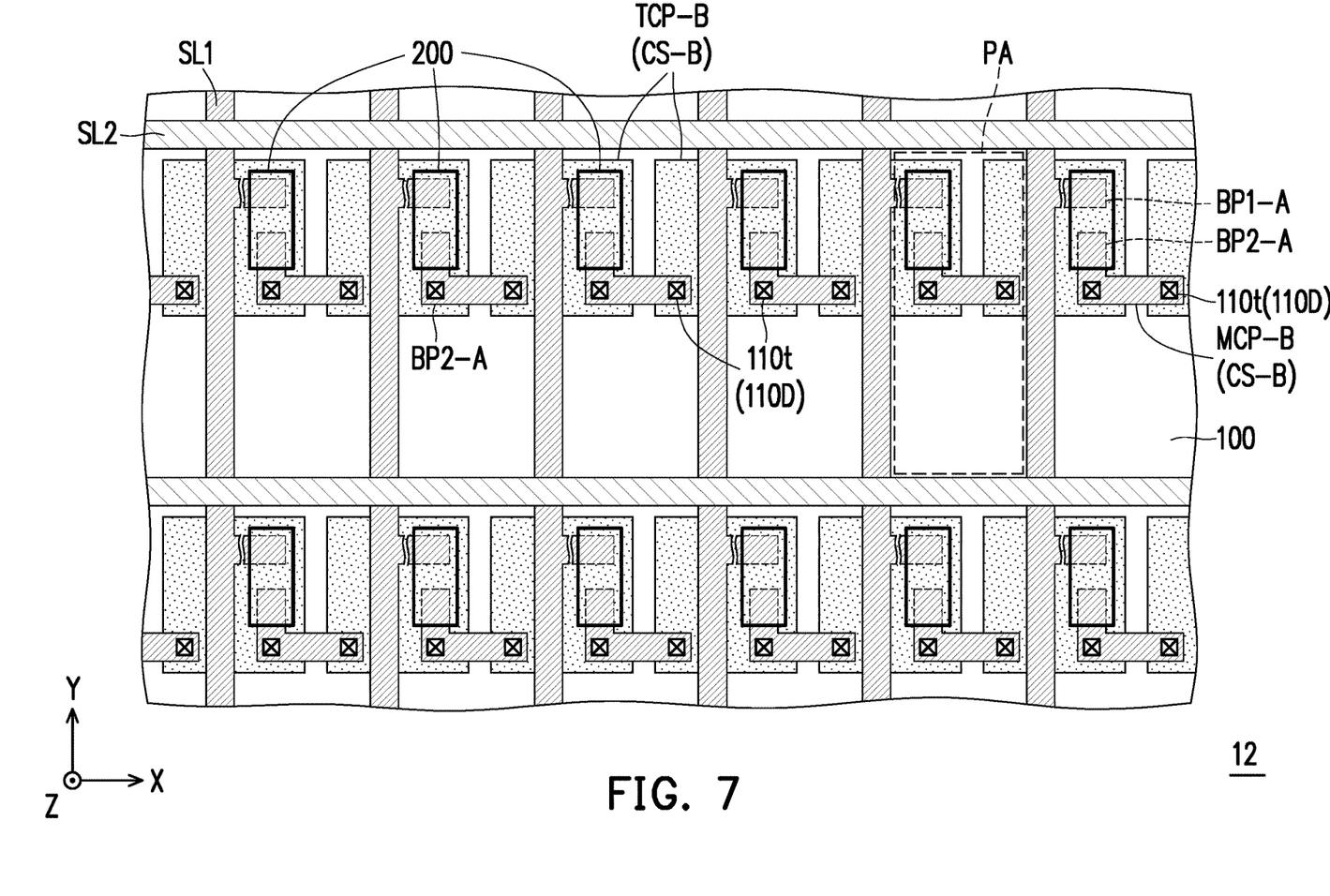
FIG. 7 is a schematic top view of a micro light emitting diode display panel according to the fifth embodiment of the disclosure.

FIG. 7 is a schematic top view of a micro light emitting diode display panel according to the fifth embodiment of the disclosure. Referring to FIG. 7, the difference between a micro light emitting diode display panel 12 in this embodiment and the micro light emitting diode display panel 11 of FIG. 6 lies in that the configuration of the conductive structure is different. In this embodiment, the number of micro light emitting diode device 200 that is overlapped with a transparent conductive pattern TCP-B is one. Therefore, the plurality of second pads BP2-A are electrically connected to the corresponding transparent conductive patterns TCP-B respectively via a plurality of contacts 110t of an insulating layer 110D, and each of the second pads BP2-A is integrated with a corresponding metal conductive pattern MCP-B. Accordingly, on the premise that the overall light transmittance of the micro light emitting diode display panel 12 is taken into account, the conductivity of a conductive structure CS-B can be further increased, thereby enhancing the driving property of the micro light emitting diode display panel 12.

Figure 8:
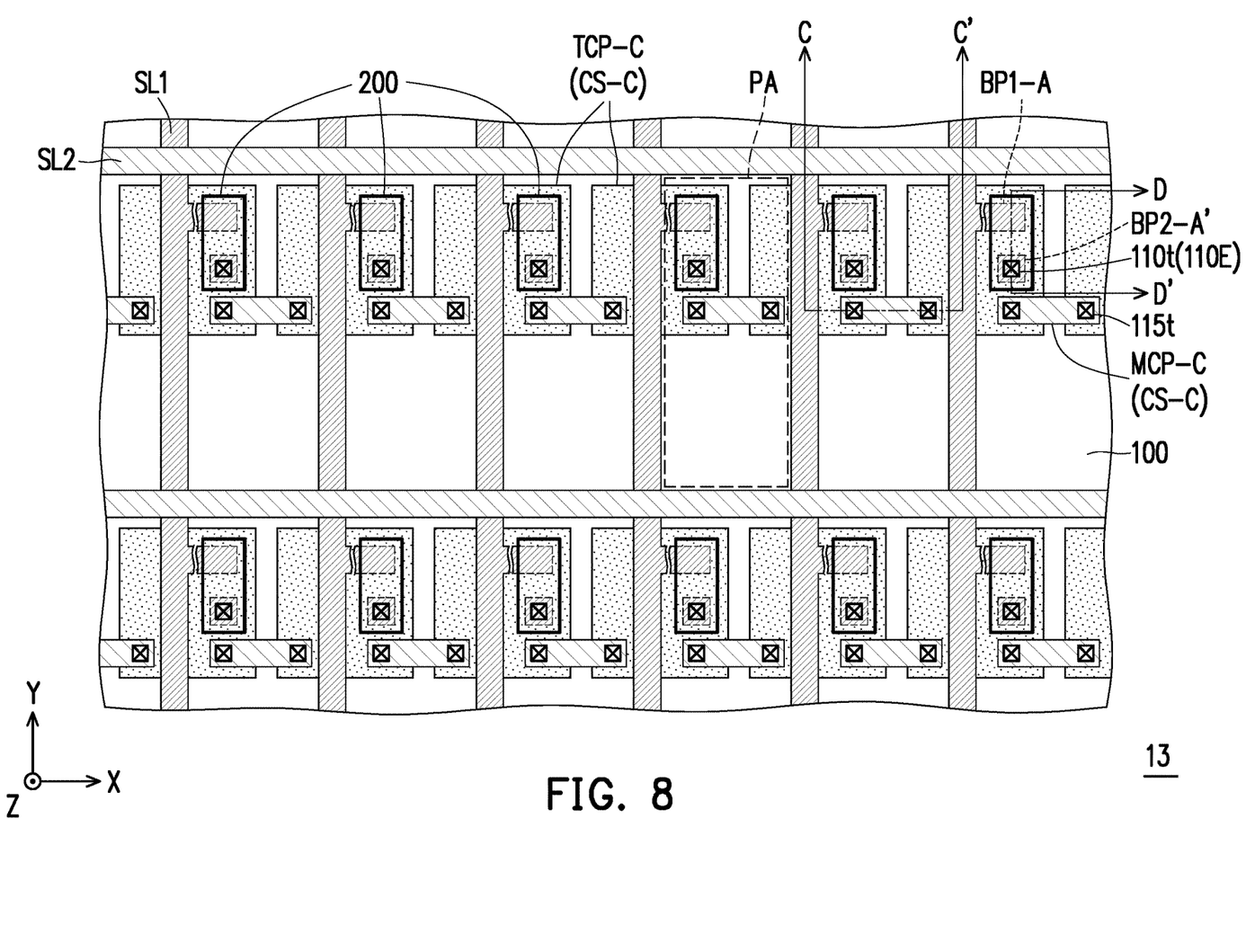
FIG. 8 is a schematic top view of a micro light emitting diode display panel according to the sixth embodiment of the disclosure.
Figure 9:
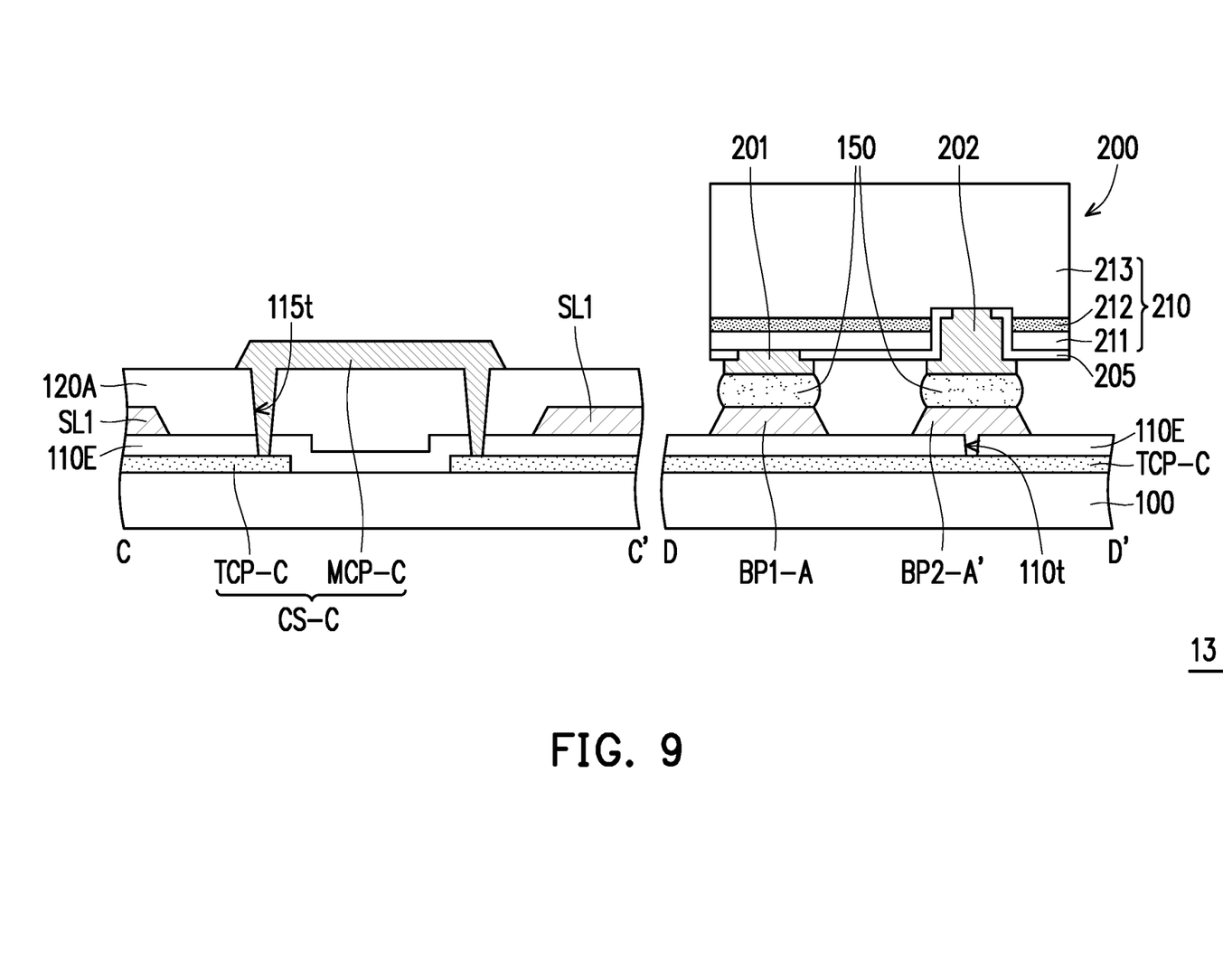
FIG. 9 is a schematic cross-sectional view of the micro light emitting diode display panel of FIG. 8.

FIG. 8 is a schematic top view of a micro light emitting diode display panel according to the sixth embodiment of the disclosure. FIG. 9 is a schematic cross-sectional view of the micro light emitting diode display panel of FIG. 8, and FIG. 9 corresponds to section line C-C' and section line D-D' of FIG. 8. Referring to FIG. 8 and FIG. 9, the difference between a micro light emitting diode display panel 13 in this embodiment and the micro light emitting diode display panel 12 of FIG. 7 lies in that the configuration of the conductive structure is different. In this embodiment, a metal conductive pattern MCP-C of a conductive structure CS-C and a second pad BP2-A' belong to different film layers.

Specifically, the metal conductive pattern MCP-C of the conductive structure CS-C and the second signal line SL2 may selectively belong to the same film layer. That is, the metal conductive pattern MCP-C may be disposed on an interlayer insulating layer 120A and electrically connected to a transparent conductive pattern TCP-C via a contact 115t of the interlayer insulating layer 120A and an insulating layer 110E. Accordingly, the design flexibility and the process window of the conductive structure CS-C can be increased. On the other hand, since the metal conductive pattern MCP-C and the corresponding second pad BP2-A' are structurally separated from each other, it is necessary for the plurality of second pads BP2-A' to be electrically connected to the corresponding transparent conductive patterns TCP-C via a plurality of contacts 110t of the insulating layer 110E.

Figure 10:
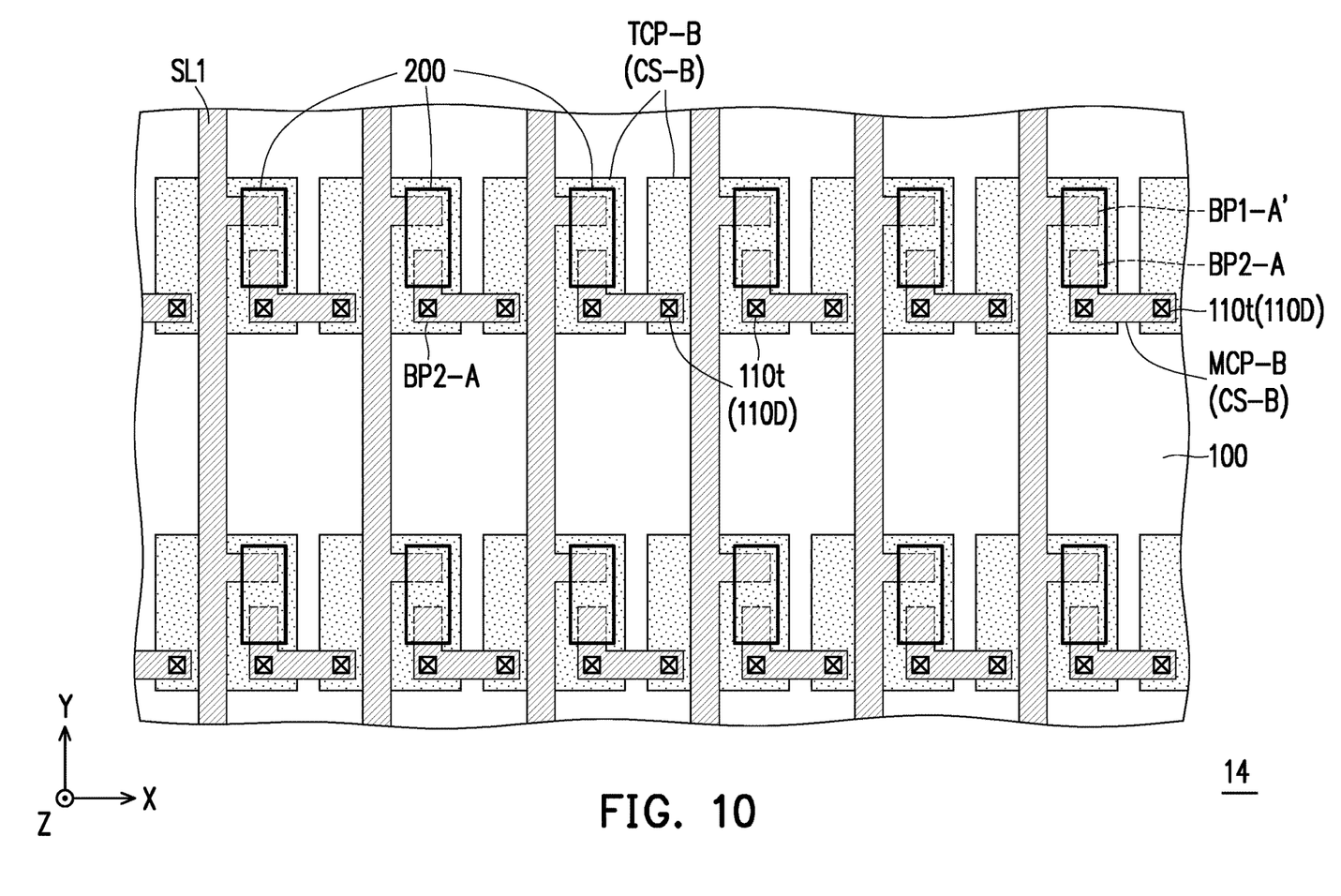
FIG. 10 is a schematic top view of a micro light emitting diode display panel according to the seventh embodiment of the disclosure.

FIG. 10 is a schematic top view of a micro light emitting diode display panel according to the seventh embodiment of the disclosure. Referring to FIG. 10, the difference between a micro light emitting diode display panel 14 in this embodiment and the micro light emitting diode display panel 12 of FIG. 7 is that the composition of the micro light emitting diode display panel is different. In this embodiment, it is possible that the micro light emitting diode display panel 14 does not have the second signal line SL2 as shown in FIG. 7 and the third signal line SL3 as shown in FIG. 3. In other words, a driving circuit layer of the micro light emitting diode display panel 14 in this embodiment is configured as a passive matrix. For example, since the micro light emitting diode display panel 14 in this embodiment does not have a transistor device (e.g., the transistor device Td and the transistor device Ts) as shown in FIG. 3, a first pad BP1-A' may thus be a part of the first signal line SL1. That is, no pixel circuit PC as shown in FIG. 3 is disposed between the first pad BP1-A' and the corresponding first signal line SL1.

In summary of the foregoing, in the micro light emitting diode display panel in an embodiment of the disclosure, the conductive structure electrically connected to the plurality of second pads is composed of the transparent conductive patterns and the plurality of metal conductive patterns that are alternately arranged. Since the transparent conductive patterns are structurally separated from each other, the overall light transmittance of the micro light emitting diode display panel can be increased. On the other hand, by employing the metal conductive patterns to bridge the transparent conductive patterns, the conductivity of the conductive structure can be increased, thereby enhancing the driving property of the micro light emitting diode display panel.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A micro light emitting diode display panel, comprising:
    a substrate;
    a plurality of first signal lines disposed on the substrate;
    a plurality of transparent conductive patterns separately distributed on the substrate;
    a plurality of metal conductive patterns arranged alternately with the transparent conductive patterns on the substrate, and the metal conductive patterns being electrically connected between the transparent conductive patterns;
    a plurality of first pads electrically connected to the first signal lines, respectively;
    a plurality of second pads electrically connected to the transparent conductive patterns; and
    a plurality of micro light emitting diode devices each electrically bonded with one of the first pads and one of the second pads.

2. The micro light emitting diode display panel according to claim 1, wherein the micro light emitting diode devices are respectively disposed between the transparent conductive patterns and are not overlapped with the transparent conductive patterns.

3. The micro light emitting diode display panel according to claim 2, wherein each of the second pads and one of the metal conductive patterns are electrically connected or integrated.

4. The micro light emitting diode display panel according to claim 1, further comprising:
    an insulating layer disposed between the transparent conductive patterns and the metal conductive patterns, wherein the insulating layer has a plurality of openings located between the transparent conductive patterns, and the metal conductive patterns are respectively located in the openings of the insulating layer.

5. The micro light emitting diode display panel according to claim 1, wherein the metal conductive patterns, the first pads, and the second pads belong to the same film layer.

6. The micro light emitting diode display panel according to claim 1, wherein at least one of the micro light emitting diode devices is overlapped with one of the transparent conductive patterns.

7. The micro light emitting diode display panel according to claim 6, wherein the number of the micro light emitting diode devices overlapped with the one of the transparent conductive patterns is three or more, and colors of light emitted by the micro light emitting diode devices are different.

8. The micro light emitting diode display panel according to claim 6, wherein adjacent two of the transparent conductive patterns are connected to each other via one of the metal conductive patterns, and any one of the second pads is overlapped with one of the transparent conductive patterns, wherein the one second pad and the one metal conductive pattern are integrated.

9. The micro light emitting diode display panel according to claim 7, wherein adjacent two of the transparent conductive patterns are connected to each other via one of the metal conductive patterns, and any one of the second pads is overlapped with one of the transparent conductive patterns, wherein the one second pad and the one metal conductive pattern are integrated.

10. The micro light emitting diode display panel according to claim 1, wherein the transparent conductive patterns are located between the metal conductive patterns and the substrate.

11. The micro light emitting diode display panel according to claim 1, further comprising:
    a plurality of transistor devices electrically connected to the micro light emitting diode devices and the first signal lines; and
    a plurality of second signal lines electrically connected to the transistor devices, and electrically independent of the first signal lines, wherein the metal conductive patterns and the second signal lines belong to the same film layer.

12. The micro light emitting diode display panel according to claim 11, wherein the second signal lines are not overlapped with the transparent conductive patterns.

* * * * *